(12) United States Patent
Lai et al.

(10) Patent No.: US 9,057,749 B2
(45) Date of Patent: Jun. 16, 2015

(54) SENSING ELEMENT AND SIGNAL SENSING DEVICE WITH THE SAME

(71) Applicant: Wistron Corporation, New Taipei (TW)

(72) Inventors: Chang-Hsin Lai, New Taipei (TW); Chen-Yu Chou, New Taipei (TW)

(73) Assignee: Wistron Corporation, New Taipei (TW)

( * ) Notice: Subject to any disclaimer, the term of this patent is extended or adjusted under 35 U.S.C. 154(b) by 129 days.

(21) Appl. No.: 13/902,985

(22) Filed: May 28, 2013

(65) Prior Publication Data

US 2014/0084938 A1  Mar. 27, 2014

(30) Foreign Application Priority Data

Sep. 26, 2012  (TW) .............................. 101135361 A (51) Int. Cl.
*G01R 31/00* (2006.01)
*G01R 29/08* (2006.01)

(52) U.S. Cl.
CPC .......... *G01R 31/001* (2013.01); *G01R 29/0814* (2013.01)

(58) Field of Classification Search
USPC ......... 324/537, 637, 639, 174, 650, 651, 251; 343/848, 846, 728, 840, 745, 834, 845, 343/850, 906; 455/575.5, 90.1
See application file for complete search history.

(56) References Cited

U.S. PATENT DOCUMENTS

| 7,518,561 B2* | 4/2009 | Mei .............................. 343/702 |
| 7,548,207 B1* | 6/2009 | Chu et al. ............... 343/700 MS |
| 7,595,765 B1* | 9/2009 | Hirsch et al. .................. 343/789 |
| 2008/0129602 A1* | 6/2008 | Qin et al. ............... 343/700 MS |
| 2008/0129632 A1* | 6/2008 | Moon et al. .................... 343/848 |
| 2011/0298669 A1* | 12/2011 | Rao et al. ...................... 343/702 |

FOREIGN PATENT DOCUMENTS

TW  M429184  5/2012

OTHER PUBLICATIONS

"Office Action of Taiwan Counterpart Application", issued on Apr. 1, 2014, with English translation thereof, p. 1-p. 8.

* cited by examiner

*Primary Examiner* — Melissa Koval
*Assistant Examiner* — Nasima Monsur
(74) *Attorney, Agent, or Firm* — Jianq Chyun IP Office (57) ABSTRACT

A sensing element suitable for sensing an interference signal radiated by an object under test is provided, including a substrate, a ground plane and a sensing antenna. The ground plane is disposed on a first surface of the substrate. The sensing antenna is disposed on the first surface of the substrate and is located on a first side of the ground plane. The sensing antenna and the ground plane are separated by a preset distance. Besides, the sensing antenna is electrically connected to the ground plane through a coaxial wire and receives the interference signal through the ground plane.

16 Claims, 6 Drawing Sheets

SENSING ELEMENT AND SIGNAL SENSING DEVICE WITH THE SAME

CROSS-REFERENCE TO RELATED APPLICATION

This application claims the priority benefit of Taiwan application serial no. 101135361, filed on Sep. 26, 2012. The entirety of the above-mentioned patent application is hereby incorporated by reference herein and made a part of this specification.

BACKGROUND OF THE INVENTION

1. Field of the Invention

The invention relates to a sensing element and a signal sensing device with the same, more particularly to a planar sensing element and a signal sensing device with the same.

2. Description of Related Art

Due to the demand for high speed and high efficacy of modern products, the operation frequency of an electronic device has been continuously increased. As the operation frequency has been increased, the harmonic wave generated by the electronic device is likely to fall within a communication band for the device, which consequently interferes the communication quality of the electronic device. Therefore, when developing electronic devices, R&D personnel usually have to detect the radio frequency interference and electromagnetic interference of the electronic device to improve the same, thereby reducing the radio frequency interference and electromagnetic interference.

Generally speaking, when testing the radio frequency interference, the R&D personnel sense the interference signal radiated by the electronic device mainly through a signal sensing device, and then improve the electronic device based on the result. Existing signal sensing devices sense the interference signal of the electronic device mainly through a sensing element. Besides, the sensing element is positioned by people. As a result, in real tests, the R&D personnel have to constantly change the position of the sensing element manually so as to carry out an overall detection on each part of the electronic device.

However, such a sensing method is not only time-consuming but is also with low sensing efficiency. Moreover, the sensed data usually vary depending on the position of the sensing element, which further decreases the credibility of the test result.

SUMMARY OF THE INVENTION

The invention provides a sensing element and a signal sensing device, using the sensing element to enhance the sensing efficiency of the signal sensing device.

The invention provides a sensing element suitable for sensing an interference signal radiated by an object under test, and includes a substrate, a ground plane, and a sensing antenna. The ground plane is disposed on a first surface of the substrate. The sensing antenna is disposed on the first surface of the substrate, located on a first side of the ground plane. The sensing antenna and the ground plane are separated by a preset distance. Particularly, the sensing antenna is electrically connected to the ground plane through a coaxial wire and receives the interference signal through the ground plane.

In one embodiment of the invention, the object under test is suitable for being placed on a second surface of the substrate and is opposite to the ground plane with the substrate in between.

In one embodiment of the invention, the sensing element further includes an auxiliary antenna, wherein the auxiliary antenna is disposed on the first surface of the substrate, located on a second side of the ground plane, and the auxiliary antenna and the ground plane are separated by the preset distance; moreover, the auxiliary antenna and the ground plane are electrically disconnected.

In one embodiment of the invention, the sensing antenna and the auxiliary antenna are identical in structure and symmetric with a geometric center of the ground plane.

In one embodiment of the invention, the sensing element further includes a coupling component, wherein the coupling component has a loop structure for surrounding the sensing antenna and the auxiliary antenna.

The invention provides a signal sensing device, including a sensing element and a plurality of supporting components. The sensing element is suitable for sensing an interference signal radiated by an object under test, and includes a substrate, a ground plane, and a sensing antenna. Particularly, the ground plane is disposed on a first surface of the substrate. The sensing antenna is disposed on the first surface of the substrate and is located on a first side of the ground plane. The sensing antenna and the ground plane are separated by a preset distance. Besides, the sensing antenna is electrically connected to the ground plane through a coaxial wire and receives the interference signal through the ground plane. The plurality of supporting components are locked on the first surface of the substrate to support the substrate. In addition, the object under test is suitable for being placed on the second surface of the substrate and is opposite to the ground plane with the substrate in between.

Based on the above, the sensing element of the invention has a planar configuration which enables the object under test to be placed directly on the sensing element. In addition, the sensing element receives the interference signal radiated by the object under test mainly by a ground plane having a bigger area. Therefore, in actual application, each part of the object under test may be thoroughly detected without constantly changing the position of the sensing element. In other words, the sensing element of the invention helps to enhance the sensing efficiency of the signal sensing device as well as the credibility of the test result.

In order to make the aforementioned features and advantages of the invention more comprehensible, embodiments accompanying figures are described in detail below.

DESCRIPTION OF EMBODIMENTS

Figure 1:
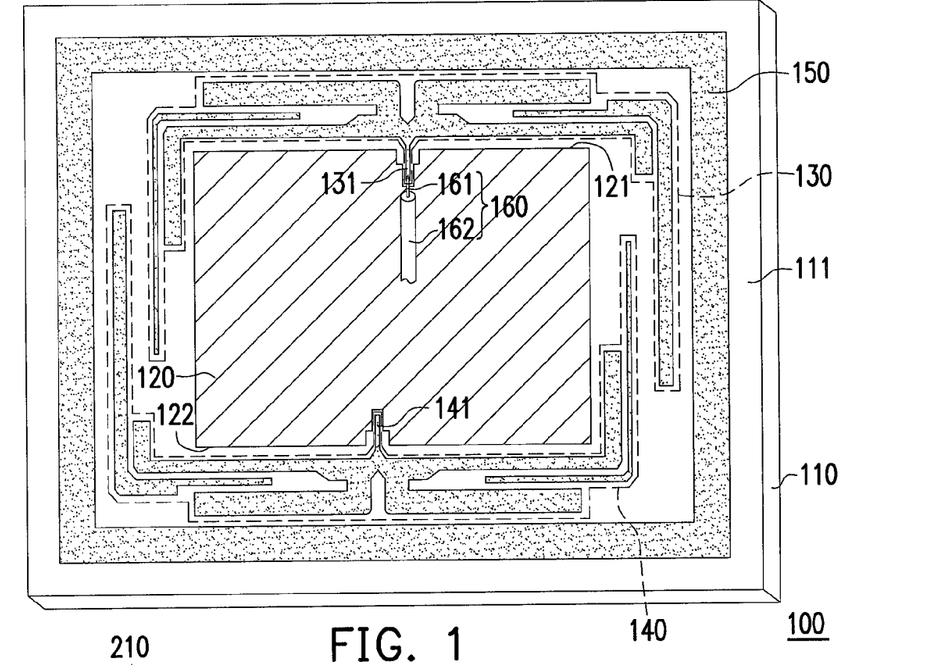
FIG. 1 is a bottom view of a sensing element according to one exemplary embodiment of the invention.

FIG. 1 is a bottom view of a sensing element according to one exemplary embodiment of the invention. Please refer to FIG. 1. A sensing element 100 includes a substrate 110, a ground plane 120, a sensing antenna 130, an auxiliary antenna 140, and a coupling component 150, wherein the substrate 110 may be, for example, a printed circuit board.

The ground plane 120 is disposed on a first surface 111 of the substrate 110 and is approximately located at the center of the substrate 110. The sensing antenna 130 is disposed on the first surface 111 of the substrate 110 and is located on a first side 121 of the ground plane 120. In addition, the sensing antenna 130 and the ground plane 120 are separated by a preset distance. The auxiliary antenna 140 is disposed on the first surface 111 of the substrate 110 and is located on a second side 122 of the ground plane 120. In addition, the auxiliary antenna 140 and the ground plane 120 are separated by a preset distance. In the embodiment, the first side 121 of the ground plane 120 is opposite to the second side 122. In other words, the sensing antenna 130 and the auxiliary antenna 140 are respectively disposed on two opposite sides of the substrate 110. The coupling component 150 has a loop structure for surrounding the sensing antenna 130 and the auxiliary antenna 140.

In terms of electrical connection, the sensing antenna 130 is electrically connected to the ground plane 120 through a coaxial wire 160. For example, the sensing antenna 130 includes a feeding part 131 which is electrically connected to an inner conductor 161 of the coaxial wire 160. In addition, an outer conductor 162 of the coaxial wire 160 is electrically connected to the ground plane 120. On the other hand, the auxiliary antenna 140 and the ground plane 120 are electrically disconnected. For example, the auxiliary antenna 140 includes a feeding part 141 which is electrically disconnected from the ground plane 120. In other words, the auxiliary antenna 140 remains floating.

Figure 2:
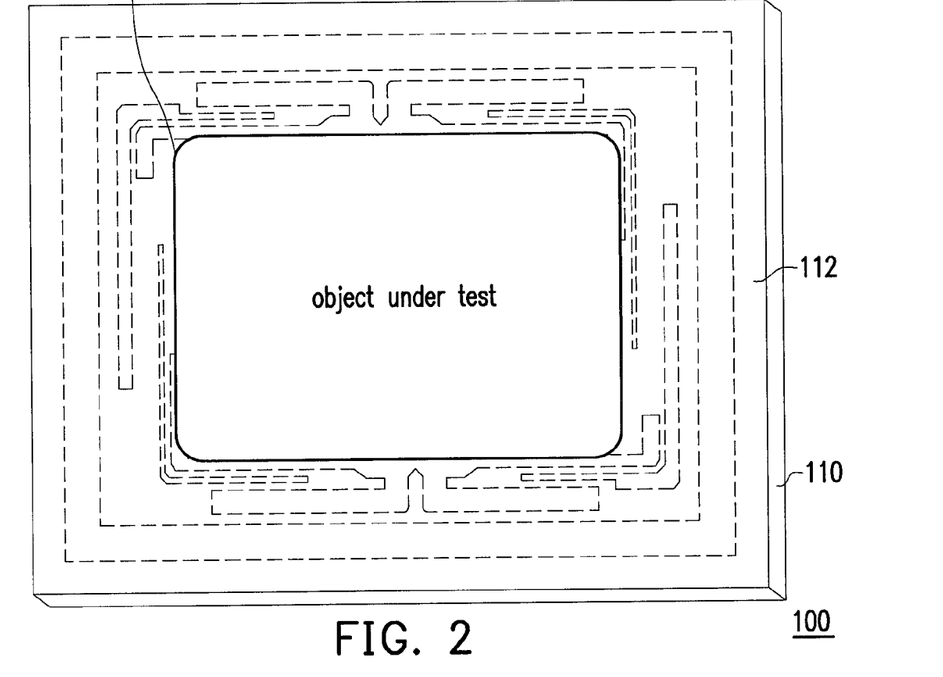
FIG. 2 is a top perspective view of a sensing element according to one exemplary embodiment of the invention.

In terms of operation, the sensing element 100 is suitable for sensing an interference signal radiated by an object under test (such as an electronic device), wherein the object under test is suitable for being placed on a second surface 112 of the substrate 110. For example, FIG. 2 is a top perspective view of a sensing element according to one exemplary embodiment of the invention. As shown in FIG. 2, an object 210 under test is suitable for being placed on the second surface 112 of the substrate 110. In addition, the positions of the ground plane 120, the sensing antenna 130, the auxiliary antenna 140, and the coupling component 150 projected on the second surface 112 are further marked in dashed lines in FIG. 2.

Please refer to both FIGS. 1 and 2. The sensing antenna 130 receives an interference signal radiated by the object 210 under test mainly through the ground plane 120. That is, the sensing antenna 130 receives the interference signal mainly through a magnetic field radiated by a negative electrode of the sensing antenna 130. Particularly, the ground plane 120 has a bigger area in comparison with the sensing antenna 130. Therefore, when the object 210 under test is placed on the second surface 112 of the substrate 110, most part of the object 210 under test is opposite to the ground plane 120 with the substrate 110 in between. As a result, the sensing element 100 may uniformly sense each part of the object 210 under test.

To be specific, the negative electrode (i.e. the ground plane 120) of the sensing antenna 130 generates a coupling effect with the auxiliary antenna 140, enabling the auxiliary antenna 140 to be equivalent to the ground plane of the sensing antenna 130. In other words, in terms of operation, the sensing antenna 130 may expand an equivalent area of the ground plane 120 through the auxiliary antenna 140. In addition, since the coupling component 150 surrounds the sensing antenna 130 and the auxiliary antenna 140, the coupling component 150 enables a radiation pattern of the sensing antenna 130 to concentrate towards the ground plane 120.

In other words, the sensing element 100 increases a sensing range of the sensing antenna 130 through the auxiliary antenna 140 and enables the radiation pattern of the sensing antenna 130 to be more concentrated through the coupling component 150. Accordingly, the sensing element 100 may be capable of sensing each part of the object under test more uniformly. It is worth mentioning that the auxiliary antenna 140 and the coupling component 150 are mainly used for further enhancing the operation performance of the sensing element 100; therefore, people having ordinary skill in the art may decide whether to dispose the auxiliary antenna 140 and the coupling component 150 depending on the design requirement.

Please refer to FIG. 1 further. The sensing antenna 130 and the auxiliary antenna 140 have identical structures and are point symmetric with a geometric center of the ground plane 120. In order to make the embodiment to be more comprehensible for people having ordinary skill in the art, a detailed structure of the sensing antenna 130 is described below.

Figure 3:
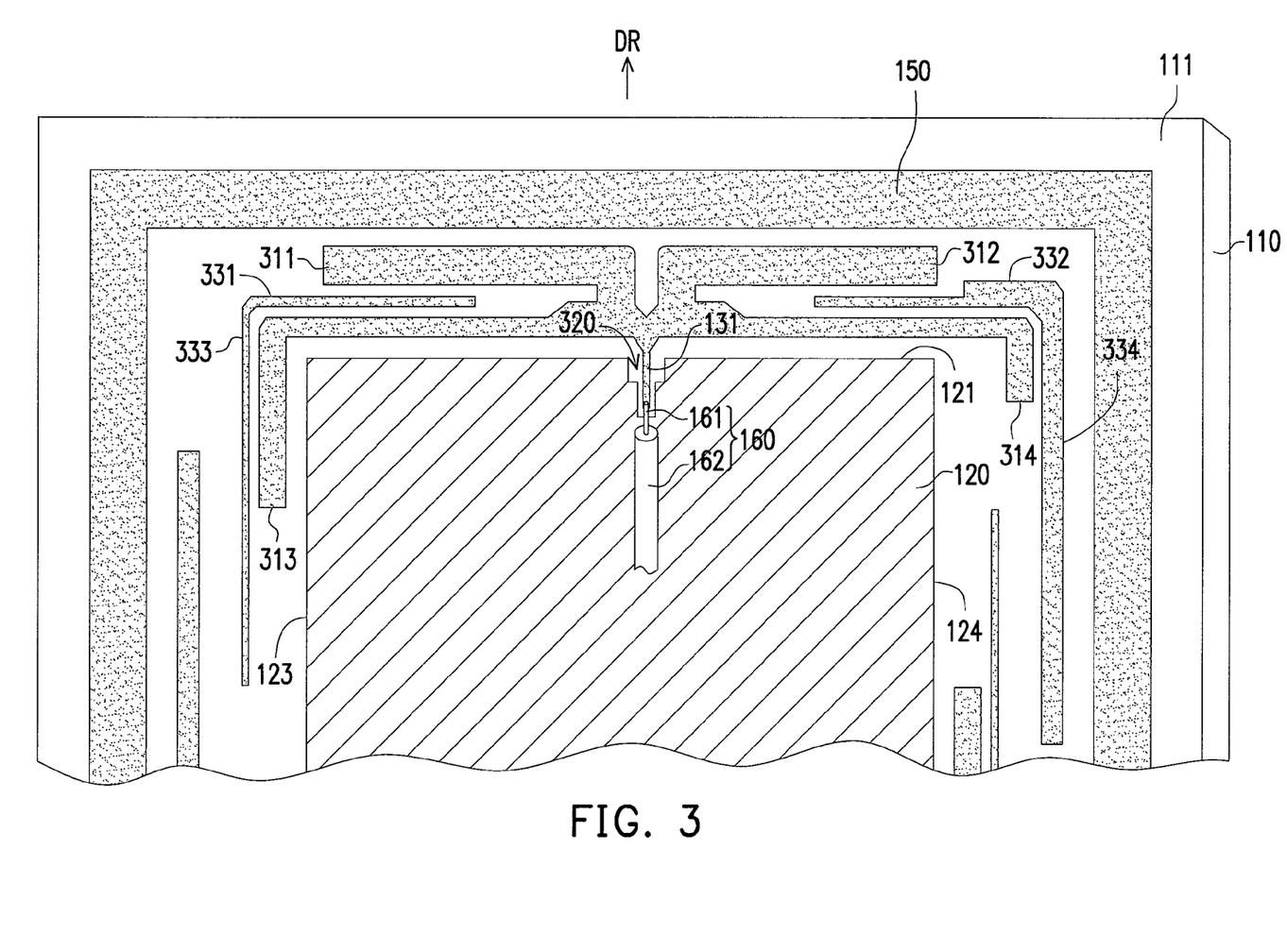
FIG. 3 is a local bottom view of a sensing element according to one exemplary embodiment of the invention.

FIG. 3 is a local bottom view of a sensing element according to one exemplary embodiment of the invention. Please refer to FIG. 3, the sensing antenna 130 includes the feeding part 131, a first radiation part 311, a second radiation part 312, a third radiation part 313, and a fourth radiation part 314, wherein the feeding part 131 is disposed in a notch 320 of the first side 121 of the ground plane 120. The first radiation part 311 is electrically connected to the feeding part 131 and extends along the first side 121 of the ground plane 120. The second radiation part 312 is electrically connected to the feeding part 131 and is symmetric with the first radiation part 311 along an extending direction DR which is perpendicular to the first side 121. The third radiation part 313 is electrically connected to the feeding part 131 and extends towards a third side 123 along the first side 121 of the ground plane 120. The fourth radiation part 314 is electrically connected to the feeding part 131 and extends towards a fourth side 124 along the first side 121 of the ground plane 120.

In the embodiment, the ground plane 120 is in a rectangular shape. The first side 121 is opposite to the second side 122. The third side 123 is opposite to the fourth side 124. Therefore, in terms of disposition, the periphery of the ground plane 120 is, so to speak, surrounded by the sensing antenna 130 and the auxiliary antenna 140. In addition, in terms of operation, the sensing antenna 130 operates in a first communication band (such as 550 MHz-824 MHz) through the first radiation part 311 and the second radiation part 312, and operates in a second communication band (such as 1.5 GHz-2.17 GHz) through the third radiation part 313 and the fourth radiation part 314.

To be specific, the sensing antenna 130 further includes a first extension part 331, a second extension part 332, a third extension part 333, and a fourth extension part 334, wherein the first extension part 331 is disposed between the first radiation part 311 and the third radiation part 313 and extends along the first side 121 of the ground plane 120. The second extension part 332 is disposed between the second radiation part 312 and the fourth radiation part 314 and extends along the first side 121 of the ground plane 120. The third extension part 333 is electrically connected to the first extension part 331 and extends along the third side 123 of the ground plane 120. The fourth extension part 334 is electrically connected to the second extension part 332 and extends along the fourth side 124 of the ground plane 120.

In terms of operation, the sensing antenna 130 expands the second communication band through the first extension part 331 and the second extension part 332. For example, as the first extension part 331 and the second extension part 332 are disposed, the second communication band may be expanded to 2.4 GHz-2.5 GHz. In addition, the sensing antenna 130 expands the first communication band through the third extension part 333 and the fourth extension part 334. For example, as the third extension part 333 and the fourth extension part 334 are disposed, the first communication band may be expanded to 750 MHz-960 MHz. In other words, the sensing antenna 130 may expand the communication band thereof through the first extension part 331 to the fourth extension part 334, so as to enable the sensing element 100 to sense the interference signal of a wide band.

Figure 4:
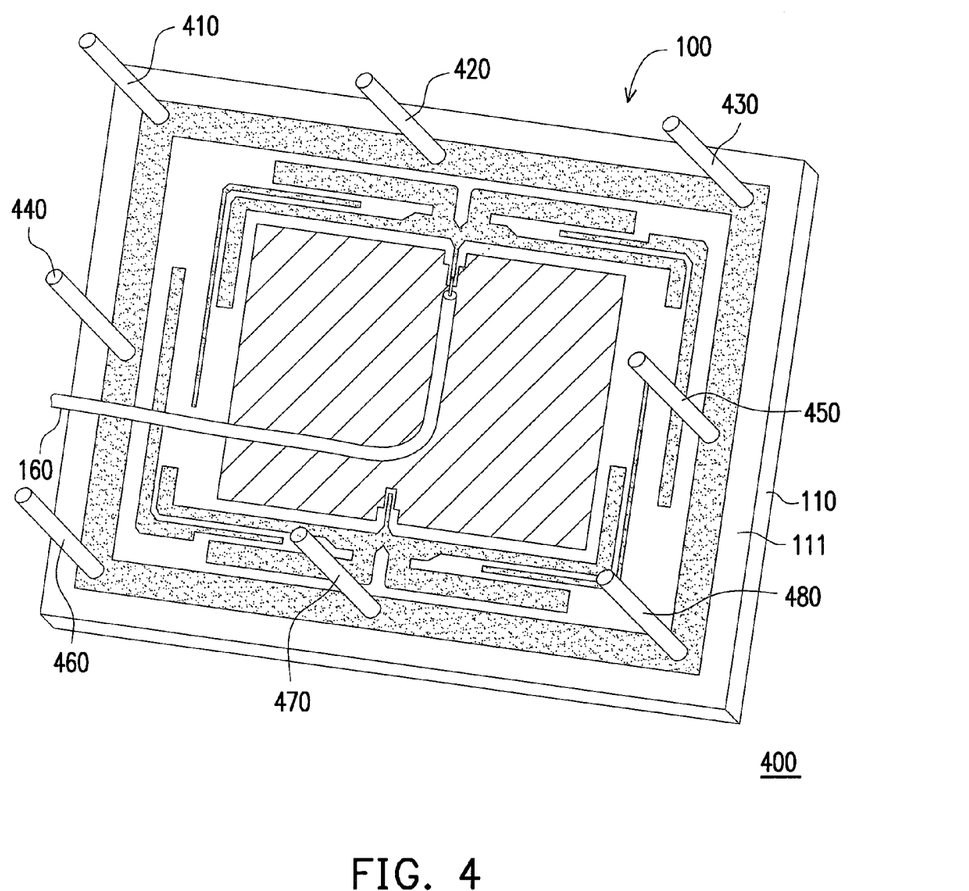
FIG. 4 is a bottom view of a signal sensing device according to one exemplary embodiment of the invention.
Figure 5:
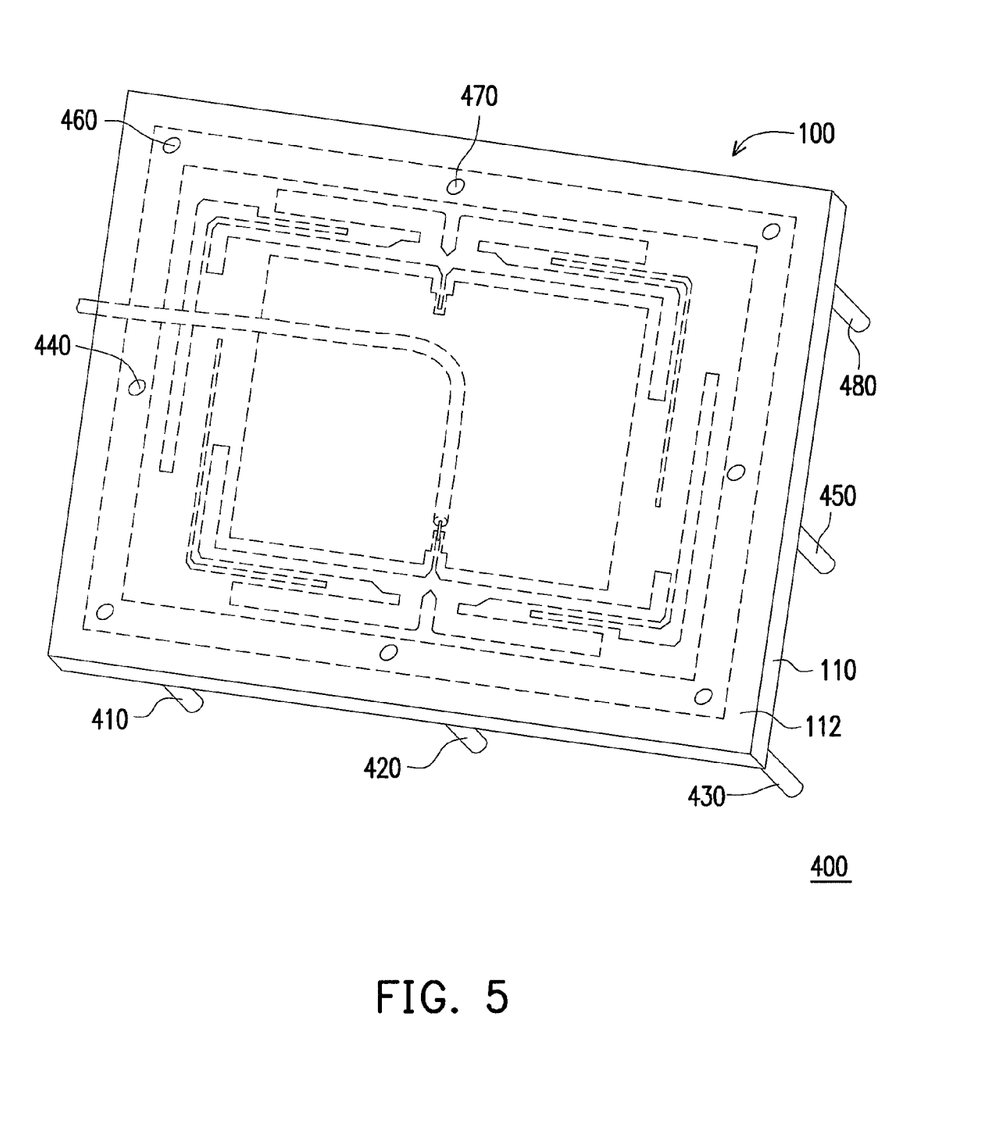
FIG. 5 is a top perspective view of a signal sensing device according to one exemplary embodiment of the invention.

It is worth mentioning that the sensing element 100 may be, for example, applied in a signal sensing device. For example, FIG. 4 is a bottom view of a signal sensing device according to one exemplary embodiment of the invention. Please refer to FIG. 4. A signal sensing device 400 includes the sensing element 100 and a plurality of supporting components 410-480, wherein the supporting components 410-480 are locked on the first surface 111 of the substrate 110 to support the substrate 100. As a result, the sensing element 100 may be erected through the supporting components 410-480. In addition, FIG. 5 is a top perspective view of a signal sensing device according to one exemplary embodiment of the invention. As shown in FIG. 5, the supporting components 410-480 are disposed on the first surface 111 of the substrate 110; as a result, when the sensing element 100 is erected, the second surface 112 of the substrate 110 is suitable for an object under test (such as an electronic device) to be placed thereon. Furthermore, the positions of the ground plane 120, the sensing antenna 130, the auxiliary antenna 140, the coupling component 150, and the coaxial wire 160 projected on the second surface 112 are further marked by dashed lines in FIG. 5.

Figure 6:
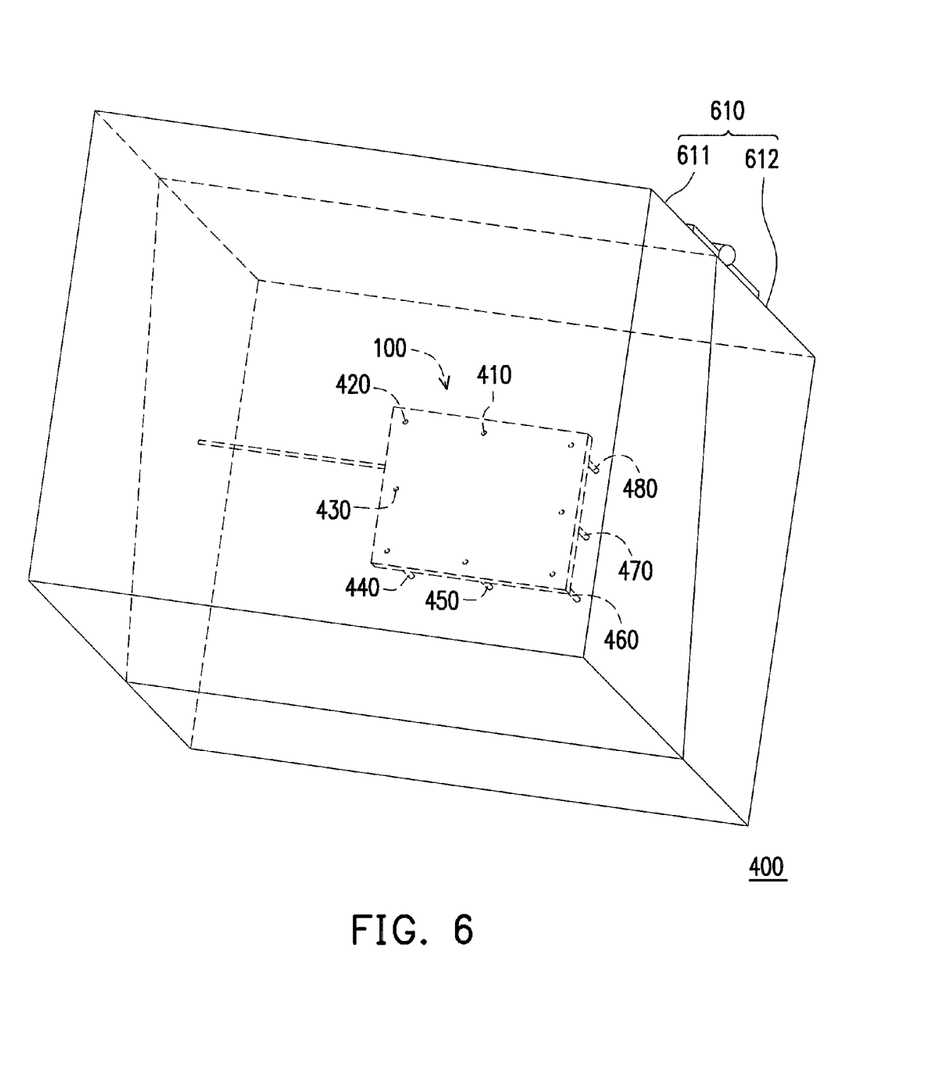
FIG. 6 is an appearance schematic view of a signal sensing device according to another exemplary embodiment of the invention.

To be specific, FIG. 6 is an appearance schematic view of a signal sensing device according to another exemplary embodiment of the invention. Please refer to both FIGS. 5 and 6, the two figures are different in that a signal sensing device 400 in FIG. 6 further includes an isolation box 610, wherein the sensing element 100 and the supporting components 410-480 are all disposed in the isolation box 610 to block extrinsic interference.

Figure 7:
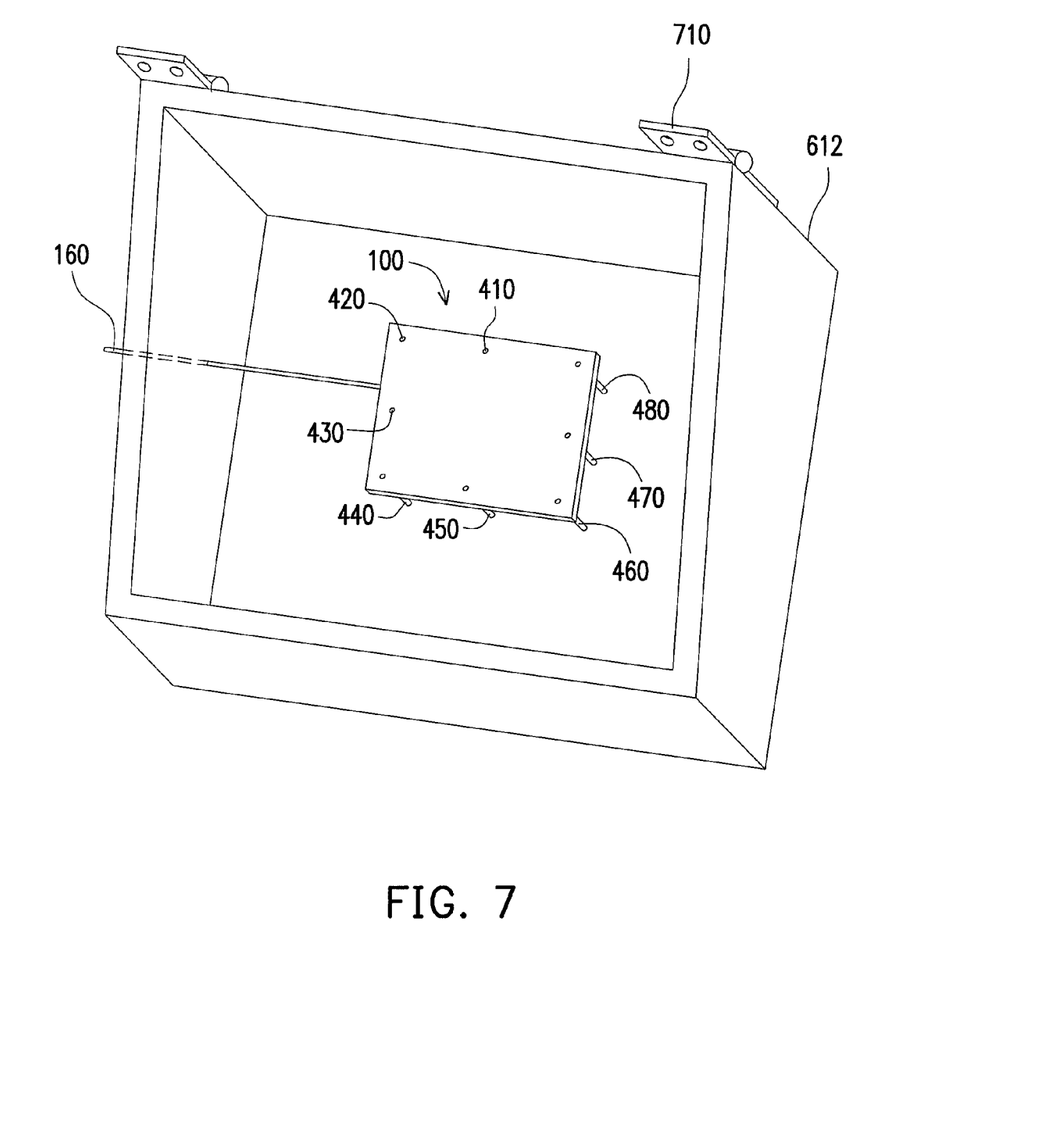
FIG. 7 is a local schematic view of the signal sensing device in FIG. 6.

For example, FIG. 7 is a local schematic view of the signal sensing device in FIG. 6. Please refer to both FIGS. 6 and 7. The isolation box 610 includes an upper case 611 and a lower case 612. In addition, there is a pivot 710 disposed between the upper case 611 and the lower case 612. Accordingly, the upper case 611 may be opened or closed relative to the lower case 612. Moreover, the sensing element 100 is erected in the isolation box 610 through the supporting components 410-480, and the coaxial wire 160 of the sensing element 100 penetrates through the isolation box 610 to extend from the inside to the outside of the isolation box 610.

In actual application, when the upper case 611 and the lower case 612 are relatively opened, the object under test may be placed in the isolation box 610 and on the sensing element 100. Besides, in the process of testing the object under test, the upper case 611 and the lower case 612 may be relatively closed so that the extrinsic interference is blocked. Furthermore, the signal sensing device 400 may be connected to a signal processor (such as a spectrum analyzer) through the coaxial wire 160 to analyze the interference signal sensed by the sensing element 100.

In summary, the sensing element of the invention has a planar configuration, and because of which the object under test may be directly placed on the sensing element so that a relative position of the sensing element and the object under test may be maintained. In addition, the sensing element receives the interference signal radiated by the object under test mainly through the ground plane having a bigger area. Therefore, in actual application, the R&D personnel may carry out the thorough detection on each part of the object under test without constantly changing the position of the sensing element. In other words, the sensing element of the invention helps to enhance the sensing efficiency of the signal sensing device as well as the credibility of the test result.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A sensing element, suitable for sensing an interference signal radiated by an object under test, comprising:
  a substrate;
  a ground plane, disposed on a first surface of the substrate; and
  a sensing antenna, disposed on the first surface of the substrate, and located on a first side of the ground plane, wherein the sensing antenna and the ground plane are separated by a preset distance, and the sensing antenna comprises:
    a feeding part, electrically connected to an inner conductor of a coaxial wire, wherein an outer conductor of the coaxial wire is electrically connected to the ground plane; and
    a first radiation part and a second radiation part, electrically connected to the feeding part, wherein the sensing antenna operates in a first communication band through the first radiation part and the second radiation part, and the sensing antenna receives the interference signal through the ground plane.

2. The sensing element according to claim 1, wherein the object under test is suitable for being placed on a second surface of the substrate and is opposite to the ground plane with the substrate in between.

3. The sensing element according to claim 1, further comprising:
  an auxiliary antenna, disposed on the first surface of the substrate, and located on a second side of the ground plane, wherein the auxiliary antenna and the ground plane are separated by the preset distance, and the auxiliary antenna is electrically disconnected from the ground plane.

4. The sensing element according to claim 3, wherein the sensing antenna and the auxiliary antenna are identical in structure and symmetric with a geometric center of the ground plane.

5. The sensing element according to claim 3, further comprising:
  a coupling component, having a loop structure for surrounding the sensing antenna and the auxiliary antenna.

6. The sensing element according to claim 1, wherein the sensing antenna further comprises:
  a third radiation part, electrically connected to the feeding part and extending towards a third side along the first side of the ground plane; and
  a fourth radiation part, electrically connected to the feeding part and extending towards a fourth side along the first side of the ground plane,
  wherein the sensing antenna operates in a second communication band through the third radiation part and the fourth radiation part, the feeding part is disposed in a notch of the first side, and the second radiation part is symmetric with the first radiation part along an extending direction perpendicular to the first side.

7. The sensing element according to claim 6, wherein the sensing antenna further comprises:
   a first extension part, disposed between the first radiation part and the third radiation part and extending along the first side of the ground plane; and
   a second extension part, disposed between the second radiation part and the fourth radiation part and extending along the first side of the ground plane,
   wherein the sensing antenna expands the second communication band through the first extension part and the second extension part.

8. The sensing element according to claim 7, wherein the sensing antenna further comprises:
   a third extension part, electrically connected to the first extension part and extending along the third side of the ground plane; and
   a fourth extension part, electrically connected to the second extension part and extending along the fourth side of the ground plane,
   wherein the sensing antenna expands the first communication band through the third extension part and the fourth extension part.

9. A signal sensing device, comprising:
   a sensing element, suitable for sensing an interference signal radiated by an object under test, comprising:
      a substrate;
      a ground plane, disposed on a first surface of the substrate; and
      a sensing antenna, disposed on the first surface of the substrate, and located on a first side of the ground plane, wherein the sensing antenna and the ground plane are separated by a preset distance, and the sensing antenna comprises:
         a feeding part, electrically connected to an inner conductor of a coaxial wire, wherein an outer conductor of the coaxial wire is electrically connected to the ground plane; and
         a first radiation part and a second radiation part, electrically connected to the feeding part, wherein the sensing antenna operates in a first communication band through the first radiation part and the second radiation part, and the sensing antenna receives the interference signal through the ground plane; and
   a plurality of supporting components, locked on the first surface of the substrate to support the substrate, wherein the object under test is suitable for being placed on a second surface of the substrate and is opposite to the ground plane with the substrate in between.

10. The signal sensing device according to claim 9, further comprising:
    an isolation box, wherein the sensing element and the plurality of supporting components are disposed in the isolation box and the coaxial wire penetrates through the isolation box.

11. The signal sensing device according to claim 9, wherein the sensing element further includes:
    an auxiliary antenna, disposed on the first surface of the substrate, and located on a second side of the ground plane, wherein the auxiliary antenna and the ground plane are separated by the preset distance, and the auxiliary antenna is electrically disconnected from the ground plane.

12. The signal sensing device according to claim 11, wherein the sensing antenna and the auxiliary antenna are identical in structure and symmetric with a geometric center of the ground plane.

13. The signal sensing device according to claim 11, wherein the sensing element further comprises:
    a coupling component, having a loop structure for surrounding the sensing antenna and the auxiliary antenna.

14. The signal sensing device according to claim 9, wherein the sensing antenna further comprises:
    a third radiation part, electrically connected to the feeding part and extending towards a third side along the first side of the ground plane; and
    a fourth radiation part, electrically connected to the feeding part and extending towards a fourth side along the first side of the ground plane,
    wherein the sensing antenna operates in a first communication band through the first radiation part and the second radiation part and operates in a second communication band through the third radiation part and the fourth radiation part, the feeding part is disposed in a notch of the first side, and the second radiation part is symmetric with the first radiation part along an extending direction perpendicular to the first side.

15. The signal sensing device according to claim 14, wherein the sensing antenna further comprises:
    a first extension part, disposed between the first radiation part and the third radiation part and extending along the first side of the ground plane; and
    a second extension part disposed between the second radiation part and the fourth radiation part and extending along the first side of the ground plane,
    wherein the sensing antenna expands the second communication band through the first extension part and the second extension part.

16. The signal sensing device according to claim 15, wherein the sensing antenna further comprises:
    a third extension part, electrically connected to the first extension part and extending along the third side of the ground plane; and
    a fourth extension part, electrically connected to the second extension part and extending along the fourth side of the ground plane,
    wherein the sensing antenna expands the first communication band through the third extension part and the fourth extension part.

* * * * *